(12) United States Patent
Sakakibara

(10) Patent No.: US 6,667,524 B1
(45) Date of Patent: Dec. 23, 2003

(54) SEMICONDUCTOR DEVICE WITH A PLURALITY OF SEMICONDUCTOR ELEMENTS

(75) Inventor: Kiyohiko Sakakibara, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/361,582

(22) Filed: Feb. 11, 2003

(30) Foreign Application Priority Data

Sep. 13, 2002 (JP) ........................... 2002-268293

(51) Int. Cl.[7] .............................................. H01L 29/72
(52) U.S. Cl. ...................... 257/391; 257/392; 257/395; 257/397; 257/295
(58) Field of Search ................................ 257/391, 392, 257/395, 397, 295

(56) References Cited

U.S. PATENT DOCUMENTS 5,430,403 A * 7/1995 Moyer et al. ............... 257/391

FOREIGN PATENT DOCUMENTS

JP 2002-43436 2/2002

* cited by examiner

*Primary Examiner*—Edward Wojciechowicz
(74) *Attorney, Agent, or Firm*—Leydig, Voit & Mayer, Ltd.

(57) ABSTRACT

A first semiconductor element is a transistor for use in a memory cell region, and a second semiconductor element is a transistor for use in a peripheral circuit region. A first total impurity concentration of a first impurity diffusion region and a second impurity diffusion region of the first semiconductor element is higher than a second total impurity concentration of a fifth impurity diffusion region of the second semiconductor element. Thus, a semiconductor device with semiconductor elements having different threshold voltages is obtained.

6 Claims, 14 Drawing Sheets

SEMICONDUCTOR DEVICE WITH A PLURALITY OF SEMICONDUCTOR ELEMENTS

BACKGROUND OF THE INVENTION

1. Field of the Invention

The present invention relates to a semiconductor device provided with a plurality of semiconductor elements, and more particularly to a semiconductor device provided with a plurality of semiconductor elements having different threshold voltages.

2. Description of the Background Art

In a semiconductor device provided with a plurality of semiconductor elements, there are cases where semiconductor elements having their threshold voltages (Vth) set different from one another are required.

A first case where such semiconductor elements having different threshold voltages (Vth) are required is as follows. In recent years, semiconductor devices having lower threshold voltages have been desired, because of increasing demands for reduction of power consumption, widening of applications of handheld equipment, securing of device reliability, and thus, the devices need to operate at low voltages (of not greater than 1 V, for example). Reduction of the threshold voltage, however, leads to an increase of sub-threshold leakage in a semiconductor element. To solve the problem, Nippon Telegraph and Telephone Corporation has developed a MT (Multi)-CMOS (Complementary Metal Oxide Semiconductor) circuit.

In a second case, semiconductor elements having different threshold voltages (Vth) are required to restrict occurrence of channel leakage in a narrow channel width transistor. In a semiconductor device having a logic circuit with an SRAM (Static Random Access Memory) built therein, it is common to make the channel width (W1) of a transistor constituting the SRAM portion narrower than the channel width (W2) of a transistor constituting a peripheral logic circuit system, to limit the area dedicated to the SRAM portion.

When a transistor having such a narrow channel width is employed, however, channel leakage increases more in the SRAM portion than in the peripheral logic circuit, specifically in a p channel transistor (Vth_typ), and especially in a low-threshold voltage (Vth) transistor (Vth_L), as shown in FIG. 19. This is presumably because the low threshold voltage of the narrow channel width transistor is decreased due to stress from an isolation insulating film region or the like.

FIG. 19 schematically shows a relation of Vg (gate voltage)—Id (drain current) of a p channel transistor. Channel leakage corresponds to a sub-threshold leakage value |log Ids| when Vg=0, as shown as Ioff in FIG. 19. As shown in FIG. 20, the channel leakage tends to increase in the narrow channel width transistor with a lower threshold voltage condition.

As described above, in a transistor used in a semiconductor device, threshold voltage setting is changed by changing dopant impurity concentration of a channel region. To change the impurity concentration of the channel region, it is necessary to cover with a resist mask a region other than a transistor forming region of a transistor having a threshold voltage to be changed, and to introduce a dopant impurity into the transistor forming region to change the threshold voltage. With this method, however, the number of manufacturing steps, WP TAT (Wafer Process Turn Around Time), and manufacturing cost of the semiconductor device will all increase.

SUMMARY OF THE INVENTION

An object of the present invention is to provide a semiconductor device having semiconductor elements of different threshold voltages, without increasing the number of manufacturing steps and others.

According to an aspect of the semiconductor device based on the present invention, the semiconductor device is provided with a first semiconductor element and a second semiconductor element of the same channel type as the first semiconductor element. The first semiconductor element includes: a first active region provided in a semiconductor substrate; a first gate electrode provided on the first active region with a first gate insulating film interposed therebetween; a pair of first impurity diffusion regions having the same conductivity type as the first active region and provided in the first active region to sandwich the first gate electrode; second impurity diffusion regions having the same conductivity type as the first impurity diffusion regions and each provided in respective one of the first impurity diffusion regions in a region shallower than a diffusion depth of the first impurity diffusion region; third impurity diffusion regions having a different conductivity type from the second impurity diffusion regions and each provided in respective one of the second impurity diffusion regions in a region shallower than a diffusion depth of the second impurity diffusion region; and fourth impurity diffusion regions having the same conductivity type as the third impurity diffusion regions and each provided in respective one of the third impurity diffusion regions in a region shallower than a diffusion depth of the third impurity diffusion region.

The second semiconductor element includes: a second active region having the same conductivity type as the first active region and provided in the semiconductor substrate; a second gate electrode provided on the second active region with a second gate insulating film interposed therebetween; a pair of fifth impurity diffusion regions corresponding to the first impurity diffusion regions and having the same conductivity type as the first impurity diffusion regions; sixth impurity diffusion regions corresponding to the third impurity diffusion regions and having the same conductivity type as the third impurity diffusion regions; and seventh impurity diffusion regions corresponding to the fourth impurity diffusion regions and having the same conductivity type as the fourth impurity diffusion regions.

Further, the first semiconductor element constitutes a transistor for use in a memory cell region, and the second semiconductor element constitutes a transistor for use in a peripheral circuit region. A first total impurity concentration of the first impurity diffusion region and the second impurity diffusion region in the first semiconductor element is set higher than a second total impurity concentration of the fifth impurity diffusion region in the second semiconductor element.

With this configuration, the first total impurity concentration constituting, e.g., an SPI (Shallow Pocket Implant) region of the first semiconductor element is set higher than the second total impurity concentration constituting, e.g., the SPI region of the second semiconductor element. Thus, it is possible to restrict channel leakage in the first semiconductor element used in the memory cell region to the same degree as in the second semiconductor element.

According to another aspect of the semiconductor device based on the present invention, the semiconductor device is provided with a first semiconductor element and a second semiconductor element of the same channel type as the first semiconductor element. The first semiconductor element includes: a first active region provided in a semiconductor substrate; a first gate electrode provided on the first active region with a first gate insulating film interposed therebetween; a pair of first impurity diffusion regions having the same conductivity type as the first active region and provided in the first active region to sandwich the first gate electrode; second impurity diffusion regions having the same conductivity type as the first impurity diffusion regions and each provided in respective one of the first impurity diffusion regions in a region shallower than a diffusion depth of the first impurity diffusion region; third impurity diffusion regions having a different conductivity type from the second impurity diffusion regions and each provided in respective one of the second impurity diffusion regions in a region shallower than a diffusion depth of the second impurity diffusion region; and fourth impurity diffusion regions having the same conductivity type as the third impurity diffusion regions and each provided in respective one of the third impurity diffusion regions in a region shallower than a diffusion depth of the third impurity diffusion region.

The second semiconductor element includes: a second active region having the same conductivity type as the first active region and provided in the semiconductor substrate; a second gate electrode provided on the second active region with a second gate insulating film interposed therebetween; a pair of fifth impurity diffusion regions corresponding to the first impurity diffusion regions and having the same conductivity type as the first impurity diffusion regions; sixth impurity diffusion regions corresponding to the third impurity diffusion regions and having the same conductivity type as the third impurity diffusion regions; and seventh impurity diffusion regions corresponding to the fourth impurity diffusion regions and having the same conductivity type as the fourth impurity diffusion regions.

Further, the first semiconductor element has a first threshold voltage, and the second semiconductor element has a second threshold voltage that is lower than the first threshold voltage. A first total impurity concentration of the first impurity diffusion region and the second impurity diffusion region in the first semiconductor element is set higher than a second total impurity concentration of the fifth impurity diffusion region in the second semiconductor element. An impurity concentration distribution in the first active region beneath the first gate electrode of the first semiconductor element is approximately the same as an impurity concentration distribution in the second active region beneath the second gate electrode of the second semiconductor element.

With this configuration, it is possible to set a difference in threshold voltage between the first and second semiconductor elements, only by the difference in impurity concentration between the SPI region in the first semiconductor element formed of the first and second impurity diffusion regions and the SPI region in the second semiconductor element formed of the fifth impurity diffusion region.

According to a further aspect of the present invention, the semiconductor device is provided with a first semiconductor element and a second semiconductor element of the same channel type as the first semiconductor element. The first semiconductor element includes: a first active region provided in a semiconductor substrate; a first gate electrode provided on the first active region with a first gate insulating film interposed therebetween; a pair of first impurity diffusion regions having the same conductivity type as the first active region and provided in the first active region to sandwich the first gate electrode; second impurity diffusion regions having the same conductivity type as the first impurity diffusion regions and each provided in respective one of the first impurity diffusion regions in a region shallower than a diffusion depth of the first impurity diffusion region; third impurity diffusion regions having a different conductivity type from the second impurity diffusion regions and each provided in respective one of the second impurity diffusion regions in a region shallower than a diffusion depth of the second impurity diffusion region; and fourth impurity diffusion regions having the same conductivity type as the third impurity diffusion region and each provided in respective one of the third impurity diffusion regions in a region shallower than a diffusion depth of the third impurity diffusion region.

The second semiconductor element includes: a second active region having the same conductivity type as the first active region and provided in the semiconductor substrate; a second gate electrode provided on the second active region with a second gate insulating film interposed therebetween; a pair of fifth impurity diffusion regions corresponding to the first impurity diffusion regions and having the same conductivity type as the first impurity diffusion regions; sixth impurity diffusion regions corresponding to the third impurity diffusion regions and having the same conductivity type as the third impurity diffusion regions; and seventh impurity diffusion regions corresponding to the fourth impurity diffusion regions and having the same conductivity type as the fourth impurity diffusion regions.

Further, a gate width of the first semiconductor element is set narrower than a gate width of the second semiconductor element, and a film thickness of the first gate oxide film of the first semiconductor element is set greater than a film thickness of the second gate oxide film of the second semiconductor element.

With this configuration, not only the impurity concentration of the SPI region in the first semiconductor element formed of the first and second impurity diffusion regions is differentiated from that of the SPI region in the second semiconductor element formed of the fifth impurity diffusion region, but also the film thicknesses of the gate oxide films in the first and second semiconductor elements are differentiated from each other. Accordingly, it is possible to further increase the difference in threshold voltage between the first and second semiconductor elements.

According to yet another aspect of the present invention, the semiconductor device is provided with a first semiconductor element and a second semiconductor element of the same channel type as the first semiconductor element. The first semiconductor element includes: a first active region provided in a semiconductor substrate; a first gate electrode provided on the first active region with a first gate insulating film interposed therebetween; a pair of first impurity diffusion regions having a different conductivity type from the first active region and provided in the first active region to sandwich the first gate electrode; and second impurity diffusion regions having the same conductivity type as the first impurity diffusion regions and each provided in respective one of the first impurity diffusion regions in a region shallower than a diffusion depth of the first impurity diffusion region.

The second semiconductor element includes: a second active region provided in the semiconductor substrate; a second gate electrode provided on the second active region with a second gate insulating film interposed therebetween; a pair of third impurity diffusion regions having the same conductivity type as the second active region and provided in the second active region to sandwich the second gate electrode; fourth impurity diffusion regions having the same conductivity type as the third impurity diffusion regions and each provided in respective one of the third impurity diffusion regions in a region shallower than a diffusion depth of the third impurity diffusion region; fifth impurity diffusion regions having a different conductivity type from the fourth impurity diffusion regions and each provided in respective one of the fourth impurity diffusion regions in a region shallower than a diffusion depth of the fourth impurity diffusion region; and sixth impurity diffusion regions having the same conductivity type as the fifth impurity diffusion regions and each provided in respective one of the fifth impurity diffusion regions in a region shallower than a diffusion depth of the fifth impurity diffusion region.

Further, in the semiconductor device, the diffusion depth of the first impurity diffusion region from the surface of the first active region is equal to the diffusion depth of the third or fourth impurity diffusion region from the surface of the second active region.

As such, the second semiconductor element is provided with the third, fourth, fifth and sixth impurity diffusion regions. The third impurity diffusion region located outermost constitutes the SPI region, and the fourth impurity diffusion region locally increases the impurity concentration of this SPI region, whereby the threshold voltage of the second semiconductor element is increased. As a result, the semiconductor device of the present invention is applicable to a semiconductor device having both a first semiconductor element unprovided with an SPI region and a second semiconductor element provided with the SPI region, e.g., as a portion of the source/drain region.

In a preferred embodiment of the semiconductor device, the first semiconductor element is an n channel type semiconductor element having the first active region of p conductivity type, and the second semiconductor element is a p channel type semiconductor element having the second active region of n conductivity type.

In another preferred embodiment, the film thickness of the first gate insulating film of the first semiconductor element is different from that of the second gate insulating film of the second semiconductor element. For example, when the semiconductor device of the present invention is adapted to a semiconductor device having an external type transistor and an internal type transistor having different operating voltages, the first gate insulating film of the first semiconductor element is made thicker than the second gate insulating film of the second semiconductor element.

In yet another preferred embodiment, the semiconductor device is further provided with a third semiconductor element of the same channel type as the second semiconductor element. The third semiconductor element includes: a third active region of the same conductivity type as the second active region and provided in the semiconductor substrate; a third gate electrode provided on the third active region with a third gate insulating film interposed therebetween; a pair of seventh impurity diffusion regions corresponding to the third impurity diffusion regions and having the same conductivity type as the third impurity diffusion regions; eighth impurity diffusion regions corresponding to the fifth impurity diffusion regions and having the same conductivity type as the fifth impurity diffusion regions; and ninth impurity diffusion regions corresponding to the sixth impurity diffusion regions and having the same conductivity type as the sixth impurity diffusion regions.

Although the third semiconductor element has the seventh impurity diffusion region constituting the SPI region similar to the third impurity diffusion region of the second semiconductor element, it does not have an impurity diffusion region corresponding to the fourth impurity diffusion region of the second semiconductor element. As a result, in the semiconductor device, it is possible to change the threshold voltages of the second and third semiconductor elements having the SPI regions.

In an aspect of a manufacturing method of a semiconductor device according to the present invention, the manufacturing method of a semiconductor device provided with a first semiconductor element and a second semiconductor element of a different channel type from the first semiconductor element includes the steps of: forming an element isolating insulating film in a prescribed region of a semiconductor substrate to define a first active region and a second active region of a different conductivity type from the first active region; forming a first gate electrode on the first active region with a first gate insulating film interposed therebetween and forming a second gate electrode on the second active region with a second gate insulating film interposed therebetween; introducing impurity of a first conductivity type into the first active region, with the first gate electrode used as a mask, to form a pair of first impurity diffusion regions having a different conductivity type from the first active region, and also introducing impurity of the first conductivity type into the second active region, with the second gate electrode used as a mask, to form a pair of fourth impurity diffusion regions having the same conductivity type as the second active region; introducing impurity of the first conductivity type into the second active region alone, with the second gate electrode used as a mask, to form a third impurity diffusion region surrounding the fourth impurity diffusion region and having an impurity diffusion depth deeper than the fourth impurity diffusion region; introducing impurity of the second conductivity type into the second active region alone, with the second gate electrode used as a mask, to form a fifth impurity diffusion region having an impurity concentration greater than that of the fourth impurity diffusion region; forming sidewall insulating films on respective sidewalls of the first and second gate electrodes; introducing impurity of the second conductivity type into the second active region alone, with the second gate electrode and the sidewall insulating film used as masks, to form a sixth impurity diffusion region in the fifth impurity diffusion region at an impurity diffusion depth that is shallower than that of the fifth impurity diffusion region; introducing impurity of the first conductivity type into the first active region alone, with the first gate electrode and the sidewall insulating film used as masks, to form a second impurity diffusion region in the first impurity diffusion region at an impurity diffusion depth that is shallower than that of the first impurity diffusion region.

The manufacturing method described above brings about a structure in which the second semiconductor element is provided with the third, fourth, fifth and sixth impurity diffusion regions, the third and fourth impurity diffusion regions constitute an SPI region, and the impurity concentration in this SPI region is locally increased as the impurities in the third and fourth impurity diffusion regions are added together. The fourth impurity diffusion region is formed at the same time as the step of forming the first impurity diffusion region in the first semiconductor element. This eliminates the need for an additional step of forming the fourth impurity diffusion region. As a result, a semiconductor device provided with a plurality of semiconductor elements having different threshold voltages can be manufactured without increasing a number of manufacturing steps, WP TAT, or manufacturing cost of the semiconductor device.

In a preferred embodiment of the manufacturing method of the semiconductor device described above, the first semiconductor element is an n channel type semiconductor device having the first active region of a p conductivity type, and the second semiconductor element is a p channel type semiconductor device having the second active region of an n conductivity type. The impurity of the first conductivity type is n type impurity, and the impurity of the second conductivity type is p type impurity.

In another preferred embodiment, the first gate insulating film of the first semiconductor element is formed to have a film thickness that is different from that of the second gate insulating film of the second semiconductor element.

In another aspect of the manufacturing method of a semiconductor device according to the present invention, the manufacturing method of a semiconductor device provided with a first semiconductor element, a second semiconductor element having a different channel type from the first semiconductor element and a third semiconductor element having the same channel type as the second semiconductor element includes the steps of: forming an element isolating insulating film in a prescribed region of a semiconductor substrate to define a first active region, a second active region having a different conductivity type from the first active region, and a third active region having the same conductivity type as the second active region; forming a first gate electrode on the first active region with a first gate insulating film interposed therebetween, forming a second gate electrode on the second active region with a second gate insulating film interposed therebetween and forming a third gate electrode on the third active region with a third gate insulating film interposed therebetween; introducing impurity of a first conductivity type into the second and third active regions, with the second and third gate electrodes used as masks, to form a pair of third impurity diffusion regions and a pair of seventh impurity diffusion regions having the same conductivity type as the second and third active regions; introducing impurity of a second conductivity type into the second and third active regions, with the second and third gate electrodes used as masks, to form fifth and eighth impurity diffusion regions in the third and seventh impurity diffusion regions, respectively, at impurity diffusion depths shallower than those of the third and seventh impurity diffusion regions; forming sidewall insulating films on sidewalls of the first gate insulating film and the first gate electrode, the second insulating film and the second gate electrode and the third gate insulating film and the third gate electrode; introducing impurity of the first conductivity type into the first and second active regions, with the first gate electrode and the corresponding sidewall insulating film, and the second gate electrode and the corresponding sidewall insulating film used as masks, to form second and fourth impurity diffusion regions in the first and third impurity diffusion regions, respectively, at impurity diffusion depths shallower than those of the first and third impurity diffusion regions; and introducing impurity of the second conductivity type into the second and third active regions, with the second gate electrode and the corresponding sidewall insulating film, and the third gate electrode and the corresponding sidewall insulating film used as masks, to form sixth and ninth impurity diffusion regions in the fifth and eighth impurity diffusion regions, respectively, at impurity diffusion depths shallower than those of the fifth and eighth impurity diffusion regions.

Although the third semiconductor element obtained with these steps has the seventh impurity diffusion region which constitutes the SPI region as does the third impurity diffusion region of the second semiconductor element, it does not have an impurity diffusion region corresponding to the fourth impurity diffusion region of the second semiconductor element. As a result, it is possible to provide a semiconductor device with a second semiconductor element and a third semiconductor element having different threshold voltages because of different concentrations of their SPI regions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, semiconductor devices and manufacturing methods thereof according to embodiments of the present invention will be described with reference to the drawings.

First Embodiment

Referring to FIGS. 1–7, the semiconductor device and manufacturing method thereof according to the first embodiment will be described.

Structure of Semiconductor Device

Figure 1:
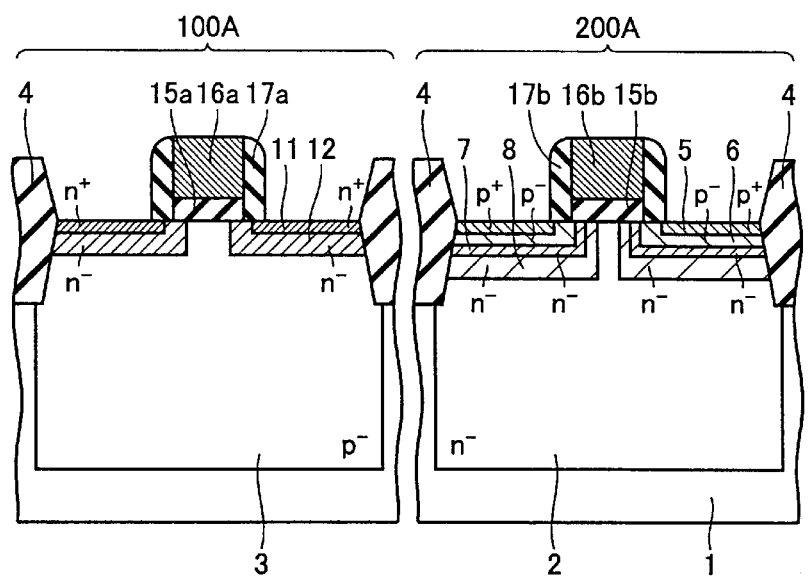
FIG. 1 is a cross sectional view showing a structure of the semiconductor device according to a first embodiment of the present invention.
Figure 2A:
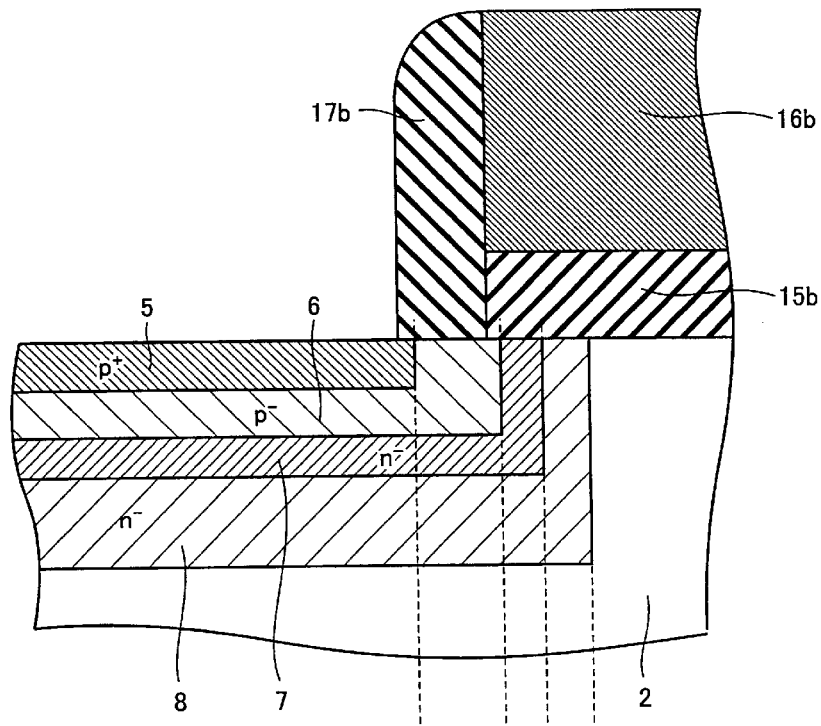
FIGS. 2A and 2B show impurity concentration profiles.
Figure 2B:
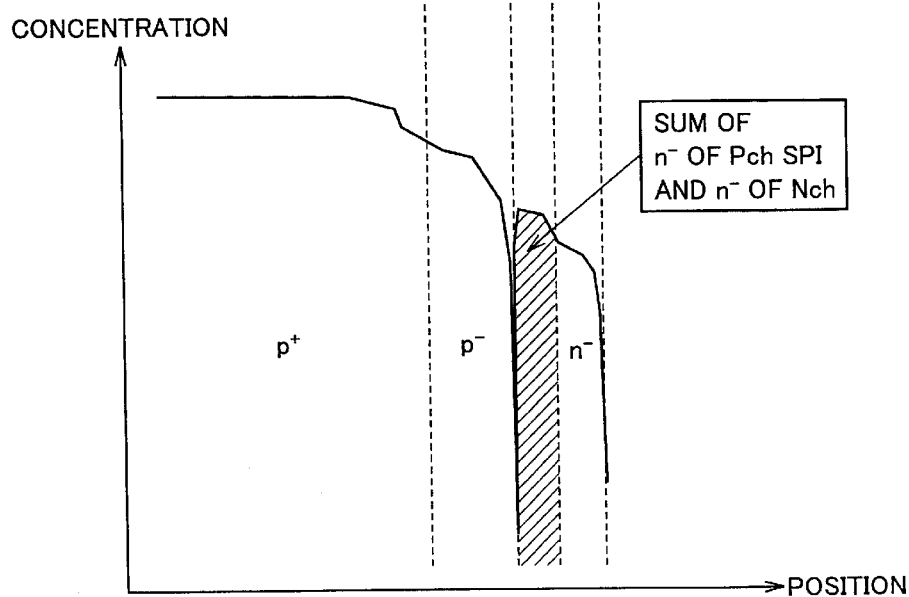

Firstly, the structure of the semiconductor device according to the present embodiment is explained with reference to FIGS. 1, 2A and 2B. The semiconductor device is provided with an n channel type MOS (Metal Oxide Semiconductor) transistor 100A as a first semiconductor element, and a p channel type MOS transistor 200A as a second semiconductor element.

N channel type MOS transistor 100A and p channel type MOS transistor 200A are electrically isolated from each other by an element isolating insulating film 4 of, e.g., SiO$_2$ that is provided in the main surface of a semiconductor substrate 1 of, e.g., silicon. N channel type MOS transistor 100A is provided with a p⁻ type well 3 as a first active region formed of a p⁻ type impurity region, and p channel type MOS transistor 200A is provided with an n⁻ type well 2 as a second active region formed of an n⁻ type impurity region.

A first gate electrode 16a is provided on p⁻ type well 3 of n channel type MOS transistor 100A, with a first gate insulating film 15a (of a film thickness of about 50 Å) of, e.g., SiO$_2$ interposed therebetween. A sidewall insulating film 17a of, e.g., SiO$_2$ is provided on sidewalls of first gate insulating film 15a and first gate electrode 16a.

In p⁻ type well 3, a pair of n⁻ type first impurity diffusion regions 12 having a different conductivity type from p⁻ type well 3 are arranged to sandwich first gate electrode 15a. An n⁺ type second impurity diffusion region 11 is provided in the respective n⁻ type first impurity diffusion region 12, in a region shallower than the diffusion depth of n⁻ type first impurity diffusion region 12. N⁻ type first impurity diffusion region 12 and n⁺ type second impurity diffusion region 11 constitute a source/drain region.

A second gate electrode 16b is provided on n⁻ type well 2 of p channel type MOS transistor 200A, with a second gate insulating film 15b (of a film thickness of about 50 Å) of, e.g., SiO$_2$ interposed therebetween. A sidewall insulating film 17b of, e.g., SiO$_2$ is provided on sidewalls of second gate insulating film 15b and second gate electrode 16b.

In n⁻ type well 2, a pair of n⁻ type third impurity diffusion regions 8 having the same conductivity type as n⁻ type well 2 are provided to sandwich second gate electrode 16b. In the respective n⁻ type third impurity diffusion region 8, an n⁻ type fourth impurity diffusion region 7 having the same conductivity type as n⁻ type third impurity diffusion region 8 and having an impurity concentration greater than that of n⁻ type third impurity diffusion region 8 is provided, in a region shallower than the diffusion depth of n⁻ type third impurity diffusion region 8.

Further, in the respective n⁻ type fourth impurity diffusion region 7, a p⁻ type fifth impurity diffusion region 6 having a different conductivity type from n⁻ fourth impurity diffusion region 7 is provided in a region shallower than the diffusion depth of n⁻ type fourth impurity diffusion region 7. In p⁻ type fifth impurity diffusion region 6, a p⁺ type sixth impurity diffusion region 5 having the same conductivity type as p⁻ type fifth impurity diffusion region 6 is provided in a region shallower than the diffusion depth of p⁻ type fifth impurity diffusion region 6.

P⁻ type fifth impurity diffusion region 6 and p⁺ type sixth impurity diffusion region 5 constitute a source/drain region. As seen from the impurity profile in FIGS. 2A and 2B, the n⁻ type concentration increases in the region where the impurities of n⁻ type third impurity diffusion region 8 and n⁻ type fourth impurity diffusion region 7 are added together. N⁻ type third impurity diffusion region 8 and n⁻ type fourth impurity diffusion region 7 located outside the source/drain region constitute an SPI (Shallow Pocket Implant) region.

The diffusion depth of n⁻ type first impurity diffusion region 12 from the surface of p⁻ type well 3 is set substantially equal to the diffusion depth of n⁻ type third impurity diffusion region 8 or n⁻ type fourth impurity diffusion region 7 from the surface of n⁻ type well 2 (channel region).

Manufacturing Method of Semiconductor Device

The manufacturing method of the semiconductor device having the structure as described above is now explained with reference to FIGS. 3–7.

Figure 3:
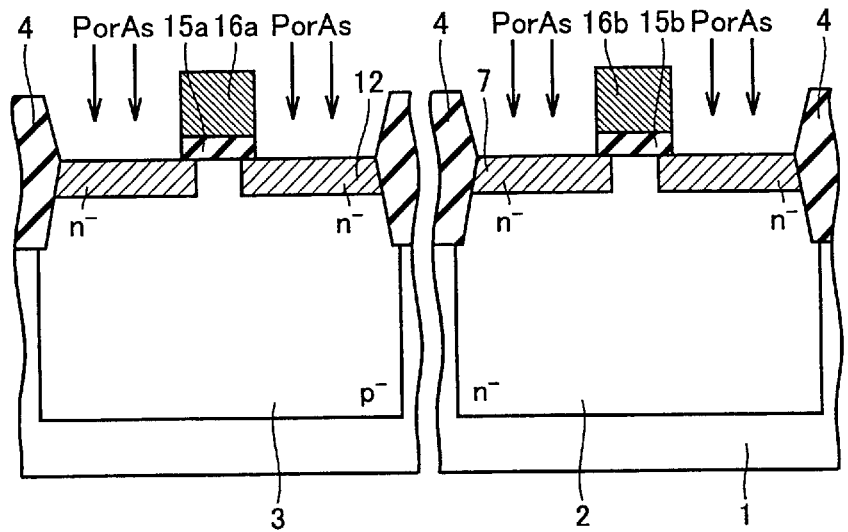
FIGS. 3–7 are cross sectional views illustrating first through fifth steps of a method of manufacturing the semiconductor device according to the first embodiment.

Referring to FIG. 3, element isolating insulating film 4 is formed in a prescribed region of semiconductor substrate 1 by LOCOS (LOCal Oxidation of Silicon). Thereafter, prescribed impurities are introduced into semiconductor substrate 1 to form p⁻ type well 3 and n⁻ type well 2. Thereafter, first gate insulating film 15a and first gate electrode 16a, and second gate insulating film 15b and second gate electrode 16b are formed by photolithography.

Next, with first gate electrode 16a and second gate electrode 16b used as masks, n type impurity (P, As or the like) is introduced into p⁻ type well 3 to form n⁻ type first impurity diffusion region 12, and at the same time, n type impurity (P, As or the like) is introduced into n⁻ type well 2 to form n⁻ type fourth impurity diffusion region 7.

The n type impurity is introduced under the conditions of implant energy of 20–40 kev (preferably, about 25 kev when introducing P) and a dose of $5 \times 10^{12}$ cm⁻² to $2 \times 10^{13}$ cm⁻² (preferably, about $1 \times 10^{13}$ cm⁻² when introducing P).

Thereafter, heat treatment may be conducted to diffuse the n type impurity region(s). This condition determines whether the n⁻ type fourth impurity diffusion region 7 is located inside or outside the n⁻ type third impurity diffusion region 8 in SPI of p channel type MOS transistor 200A (Illustrated is the case where n⁻ type fourth impurity diffusion region 7 is located inside n⁻ type third impurity diffusion region 8.)

Figure 4:
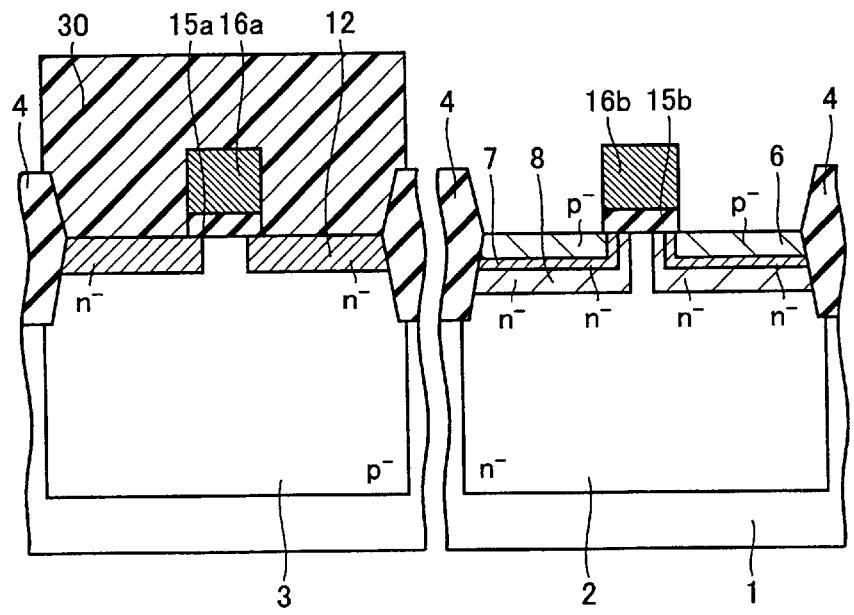

Next, referring to FIG. 4, with the surface of p⁻ type well 3 covered with a resist mask 30, and with second gate electrode 16b used as a mask, n type impurity (P, As or the like) is introduced into n⁻ type well 2 to form n⁻ type third impurity diffusion region 8. If P is employed as the n type impurity, it is introduced under the conditions of implant energy of about 50 kev and a dose of about $1.5 \times 10^{13}$ cm⁻², by rotational implantation at about 45 degrees with respect to the surface of p⁻ type well 3.

Thereafter, with second gate electrode 16b used as a mask, p type impurity (B, BF$_2$ or the like) is introduced into n⁻ type well 2 to form p⁻ type fifth impurity diffusion region 6. When BF$_2$ is employed as the p type impurity, it is introduced under the conditions of implant energy of about 25 kev and a dose of about $1 \times 10^{14}$ cm⁻².

Figure 5:
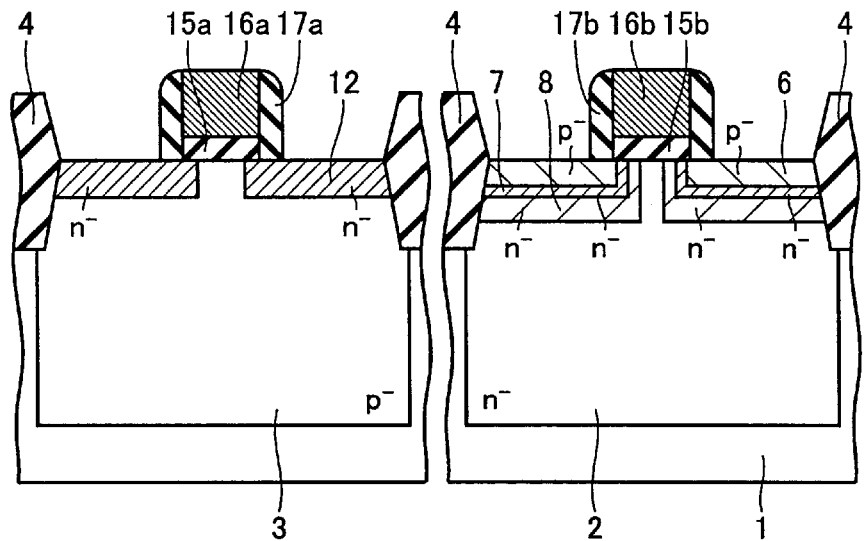

Next, referring to FIG. 5, after removal of resist mask 30, sidewall insulating films 17a and 17b are formed on the sidewalls of first gate insulating film 15a and first gate electrode 16a, and on the sidewalls of second gate electrode 15b and second gate electrode 16b, respectively.

Figure 6:
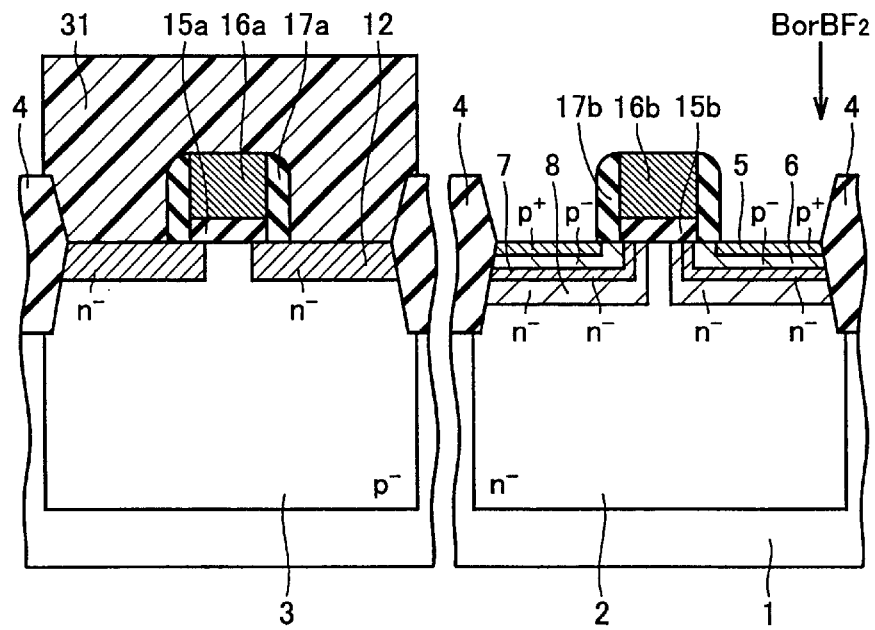

Next, referring to FIG. 6, with the surface of p⁻ type well 3 covered again with a resist mask 31, and with second gate electrode 16b and sidewall insulating film 17b used as masks, p type impurity (B, BF$_2$ or the like) is introduced into n⁻ type well 2 to form p⁺ type sixth impurity diffusion region 5. When BF$_2$ is employed, it is introduced at implant energy of about 25 kev in a dose of about $2 \times 10^{15}$ cm⁻².

Figure 7:
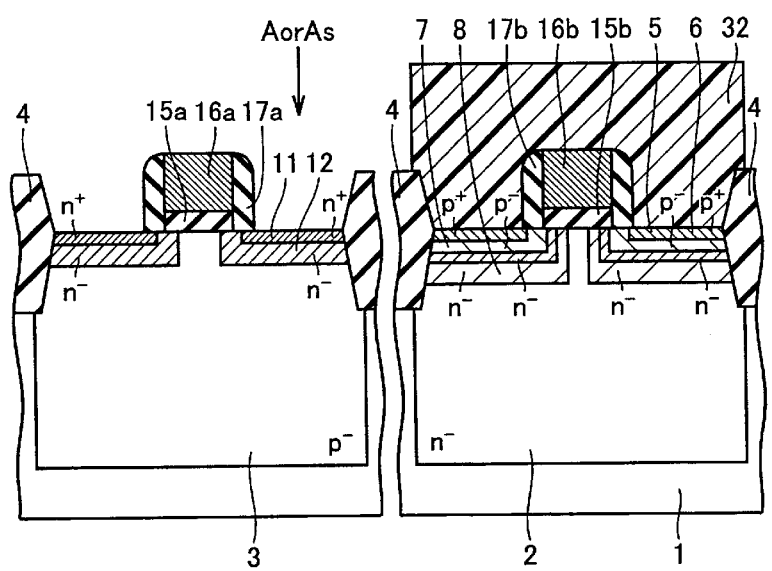

Next, referring to FIG. 7, with the surface of n⁻ type well 2 covered with a resist mask 32, and with first gate electrode 16a and sidewall insulating film 17a used as masks, n type impurity (P, As or the like) is introduced into n⁻ type well 2 to form n⁺ type second impurity diffusion region 11. When As is employed, it is introduced at implant energy of about 40 kev in a dose of about $2 \times 10^{15}$ cm⁻².

Through the steps as described above, the semiconductor device of the present embodiment provided with n channel type MOS transistor 100A and p channel type MOS transistor 200A is manufactured.

Functions and Effects

According to the semiconductor device of the present embodiment, p channel type MOS transistor 200A is provided with n⁻ type third impurity diffusion region 8, n⁻ type fourth impurity diffusion region 7, p⁻ type fifth impurity diffusion region 6 and p⁺ type sixth impurity diffusion region 5, and the SPI region is formed with n⁻ type fourth impurity diffusion region 7 and n⁻ type third impurity diffusion region 8. Impurity concentration is locally increased in the SPI region where the impurities in n⁻ type fourth impurity diffusion region 7 and n⁻ type third impurity diffusion region 8 are added together. Thus, the threshold voltage of p channel type MOS transistor 200A can be increased.

Further, as the p channel type MOS transistor, a p channel type MOS transistor of a low threshold voltage having the SPI region formed solely of n⁻ type third impurity diffusion region 8 (not shown) and a p channel type MOS transistor of a high threshold voltage having the SPI region formed of n⁻ type fourth impurity diffusion region 7 and n⁻ type third impurity diffusion region 8 (as illustrated) can be mounted together within the same semiconductor device.

Still further, according to the manufacturing method of the semiconductor device having the above-described structure, as seen from the manufacturing step shown in FIG. 3, n⁻ type fourth impurity diffusion region 7 is formed at the same time as the step of forming n⁻ type first impurity diffusion region 12 in n channel type MOS transistor 100A. Thus, an additional step of forming n⁻ type fourth impurity diffusion region 7 becomes unnecessary. As a result, it is possible to manufacture a semiconductor device provided with a plurality of p channel type MOS transistors having different threshold voltages, without increasing the number of manufacturing steps, WP TAT, and manufacturing cost of the semiconductor device.

Figure 8:
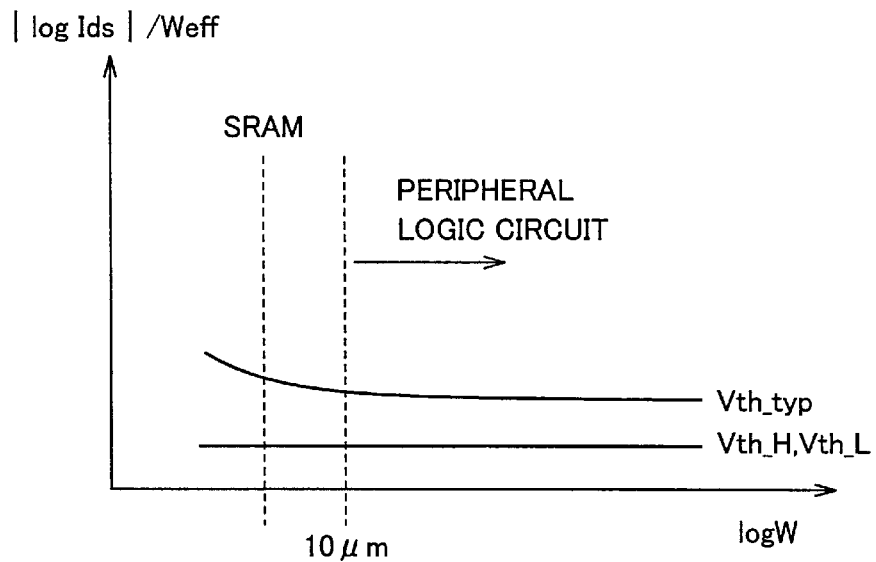
FIG. 8 is a graph showing a relation between |log Ids|/Weff and logW of the semiconductor device according to the first embodiment.

Assume that, in the semiconductor device configured as above, p channel type MOS transistor 200A of the present embodiment having a high threshold voltage and provided with the SPI region, is adapted to a p channel type MOS transistor having the narrowest channel width within the semiconductor device. FIG. 8 shows the relation between |log Ids|/Weff and logW, and FIG. 9 schematically shows the relation between Vg (gate voltage)—Id (drain current) in such a case.

Referring to FIG. 8, it has been found that the low threshold voltage p channel type MOS transistor having the SPI region formed only of n⁻ type third impurity diffusion region 8 exhibits |log Ids|/Weff dependency of Vth_typ, whereas the high threshold voltage p channel type MOS transistor having the SPI region formed of n⁻ type fourth impurity diffusion region 7 and n⁻ type third impurity diffusion region 8 exhibits |log Ids|/Weff dependency of Vth_H, although they have the channel regions of identical structures beneath the gate electrodes. FIG. 9 shows the same as transistor Vg-Id curves (W=Wa).

Figure 9:
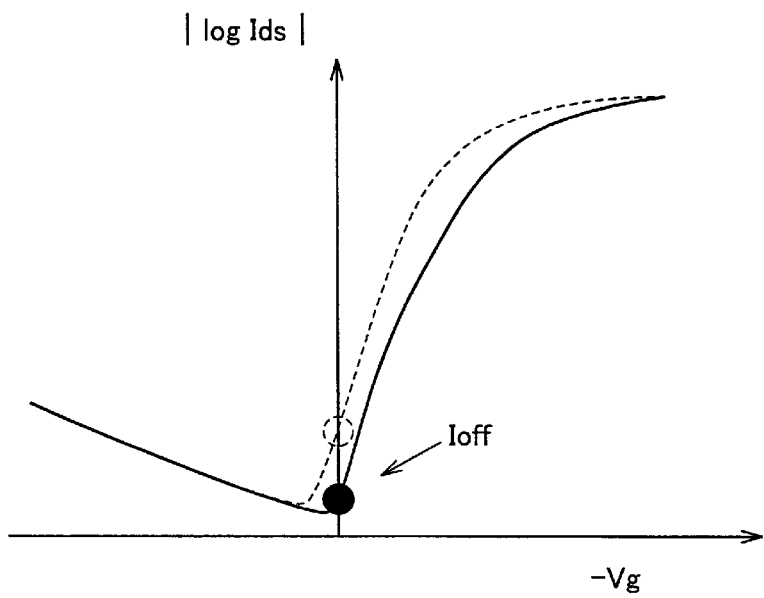
FIG. 9 schematically shows a relation of Vg (gate voltage)—Id (drain current) of the semiconductor device of the first embodiment.

Referring to FIG. 9, the dotted line shows the case of p channel type MOS transistor having its SPI region formed solely of n⁻ type third impurity diffusion region 8, and the solid line shows the case of p channel type MOS transistor having its SPI region formed of n⁻ type fourth impurity diffusion region 7 and n⁻ type third impurity diffusion region 8. The latter has a higher threshold voltage Vth. That is, it has been found that Ioff (channel leakage) when Vg=0 V is also reduced.

In the region where the channel width is not greater than 1 μm, the Vth_Typ transistor experiences a considerable decrease of threshold voltage Vth, and an increase of leakage as shown in FIG. 8 is found. With the Vth_H transistor of the present embodiment, however, such an increase of leakage amount is not found in the narrow channel width region, so that a remarkable leakage-preventing effect is confirmed.

Second Embodiment

The semiconductor device and manufacturing method thereof according to the second embodiment of the present invention are now described with reference to FIG. 10.

Structure of Semiconductor Device

Figure 10:
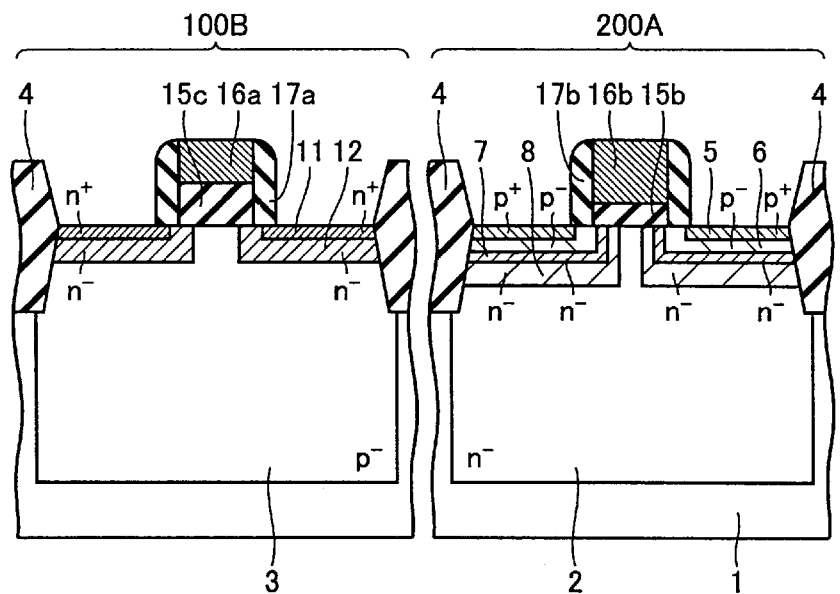
FIGS. 10–12 are cross sectional views illustrating structures of the semiconductor devices according to second through fourth embodiments of the present invention.

Firstly, referring to FIG. 10, the structure of the semiconductor device of the present embodiment is compared with that of the first embodiment. In the semiconductor device of the first embodiment, the film thickness of first gate insulating film 15a of n channel type MOS transistor 100A and the film thickness of second gate insulating film 15b of p channel type MOS transistor 200A have been set substantially equal to each other (about 50 Å).

By comparison, in the semiconductor device of the present embodiment, a first gate insulating film 15c of an n channel type MOS Transistor 100B is formed to have a film thickness (about 150 Å) that is greater than that of second gate insulating film 15b of p channel type MOS transistor 200A. Otherwise, the configuration and manufacturing method of the second embodiment are identical to those of the first embodiment, so that the same or corresponding portions are denoted by the same reference characters, and description thereof will not be repeated.

Functions and Effects

As shown in FIG. 10, provision of n⁻ type third impurity diffusion region 8 as the SPI region restricts extension of the depletion layer, so that the breakdown voltage of the source/drain junction decreases. Thus, a transistor like the n channel type MOS transistor 100B unprovided with the SPI region is commonly used as a transistor of high breakdown voltage. Such a high breakdown voltage type transistor is applicable to a microcomputer, where an external operating voltage is 5.0 V or 3.3 V and an internal operating voltage is 2.5 V, and the internal operating voltage is lowered by VDC (Voltage Down Converter) in the high breakdown voltage type transistor.

In such a case, an internal type transistor and an external type transistor have different operating voltages, and have gate oxide films of different film thicknesses, with the gate oxide film of the external type transistor being thicker than that of the internal type transistor. Accordingly, the semiconductor device according to the present embodiment is suitably applied to a semiconductor device provided with an external type transistor and an internal type transistor having different operating voltages.

Although the case where the external type transistor has a thicker gate oxide film has been described, the external type transistor is also configured to have a gate length longer than that of the internal type transistor. Accordingly, the structure of the present invention is also applicable to a semiconductor device provided with a plurality of transistors having different gate lengths.

Third Embodiment

The semiconductor device and manufacturing method thereof according to the third embodiment are now described with reference to FIG. 11.

Structure of Semiconductor Device

Figure 11:
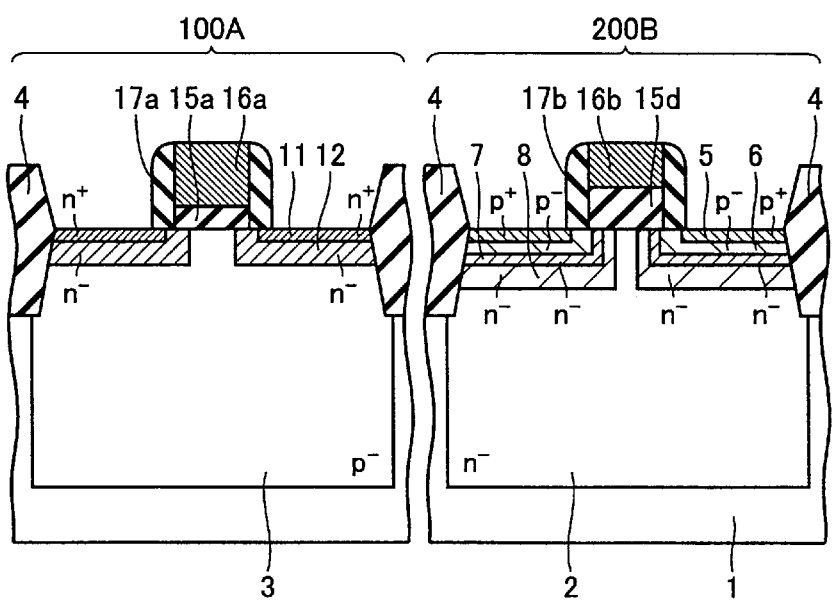

Firstly, referring to FIG. 11, the structure of the semiconductor device of the present embodiment is compared with that of the first embodiment. In the semiconductor device of the first embodiment, the film thickness of first gate insulating film 15a of n channel type MOS transistor 100A and the film thickness of second gate insulating film 15b of p channel type MOS transistor 200A have been made substantially equal to each other (about 50 Å).

In the semiconductor device according to the present embodiment, a second gate insulating film 15d in a p channel type MOS transistor 200B is formed to have a film thickness (about 150 Å) that is greater than that of first gate insulating film 15a of n channel type MOS transistor 100A. Although p channel type MOS transistor 200B having second gate insulating film 15d thicker than first gate insulating film 15a of n channel type MOS transistor 100A has been shown representatively in FIG. 11, it is assumed that, in the entire semiconductor device, there also exists p channel type MOS transistor 200A provided with second gate insulating film 15b having the same film thickness as first gate insulating film 15a of n channel type MOS transistor 100A. Otherwise, the configuration and manufacturing method of the present embodiment are identical to those of the first embodiment, and thus, the same or corresponding portions are denoted by the same reference characters, and description thereof is not repeated.

Functions and Effects

In a p channel type MOS transistor, if the channel region and the source/drain region have the same impurity profile (as in the case of p channel type MOS transistor 200A and p channel type MOS transistor 200B), the threshold voltage (Vth) becomes higher with the thicker gate oxide film.

Thus, using a thick gate oxide film in the p channel type MOS transistor makes it possible to obtain a p channel type MOS transistor having a high threshold voltage (Vth).

Fourth Embodiment

The semiconductor device and manufacturing method thereof according to the fourth embodiment are now described with reference to FIGS. 12–16.

Structure of Semiconductor Device

Figure 12:
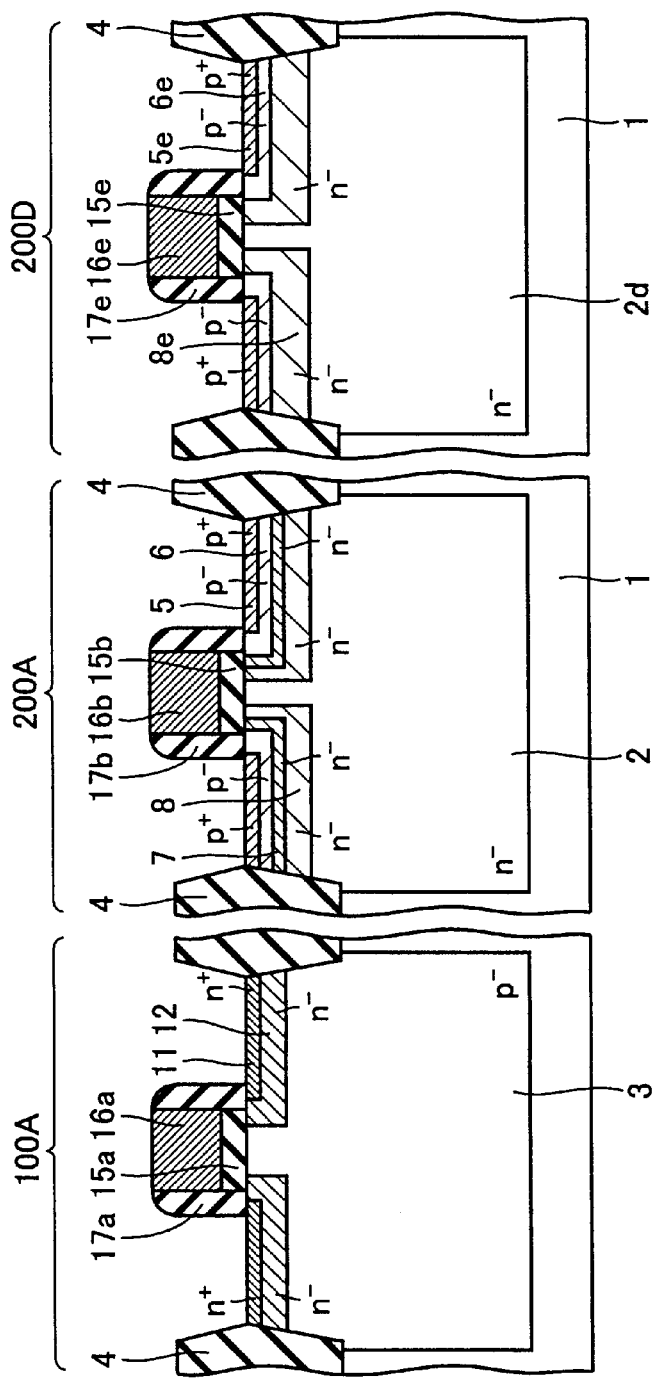

Firstly, referring to FIG. 12, the structure of the semiconductor device of the present embodiment is explained. The semiconductor device is provided with an n channel type MOS transistor 100A as a first semiconductor element, a p channel type MOS transistor 200A as a second semiconductor element, and a p channel type MOS transistor 200D as a third semiconductor element. P channel type MOS transistor 200A as the second semiconductor element is a transistor provided, e.g., in a memory cell region. P channel type MOS transistor 200D as the third semiconductor element is a transistor provided, e.g., in a peripheral circuit region.

N channel type MOS transistor 100A and p channel type MOS transistor 200A as the second semiconductor element have the same structures as those in the first embodiment, and thus, they are denoted by the same reference characters, and description thereof is not repeated.

The structure of p channel type MOS transistor 200D is basically the same as that of p channel type MOS transistor 200A, except that an impurity region corresponding to n⁻ type fourth impurity diffusion region 7 is unprovided. Otherwise, it is identical to p channel type MOS transistor 200A, and is provided with a third gate insulating film 15e, a third gate electrode 16e, a sidewall insulating film 17e, an n⁻ type seventh impurity diffusion region 8e corresponding to n⁻ type third impurity diffusion region 8, a p⁻ type eighth impurity diffusion region 6e corresponding to p⁻ type fifth impurity diffusion region 6, and a p⁺ type ninth impurity diffusion region 5e corresponding to p⁺ type sixth impurity diffusion region 5.

Thus, p channel type MOS transistor 200A is of a high threshold voltage type as is provided with n⁻ type fourth impurity diffusion region 7, whereas p channel type MOS transistor 200D is of a low threshold voltage type.

Manufacturing Method of Semiconductor Device

The manufacturing method of the semiconductor device having such a structure is now explained with reference to FIGS. 13–16. The step of forming element isolating insulating film 4 and the step of forming first gate electrode 16a, second gate electrode 16b and third gate electrode 16e are the same as described above, and thus, description thereof is not repeated.

Figure 13:
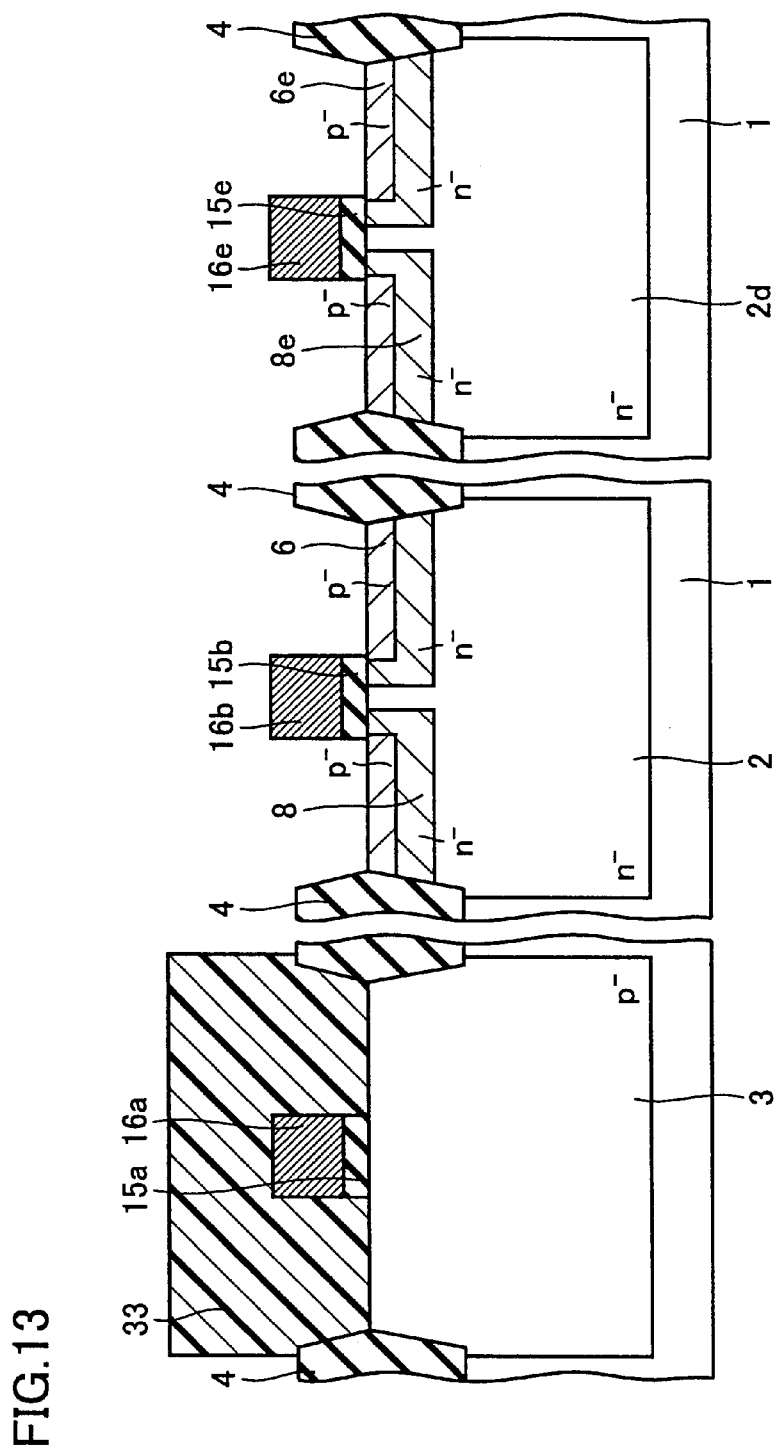
FIGS. 13–16 are cross sectional views illustrating first through fourth steps of a method of manufacturing the semiconductor device according to the fourth embodiment.

Thereafter, referring to FIG. 13, with the surface of p⁻ type well 3 covered with a resist mask 33, and with second gate electrode 16b and third gate electrode 16e used as masks, n type impurity (P, As or the like) is introduced into n⁻ type well 2 to form n⁻ type third impurity diffusion region 8 and n⁻ type seventh impurity diffusion region 8e. When P is employed as the n type impurity, it is introduced under the conditions of implant energy of about 50 kev and a dose of about $1.5 \times 10^{13}$ cm$^{-2}$, by rotational implantation at an angle of about 45 degrees with respect to the surface of p⁻ type well 3.

Thereafter, with second gate electrode 16b and third gate electrode 16e used as masks, p type impurity (B, BF$_2$ or the like) is introduced into n⁻ type well 2 to form p⁻ type fifth impurity diffusion region 6 and p⁻ type eighth impurity diffusion region 6e. When BF$_2$ is employed as the p type impurity, it is introduced at implant energy of about 25 kev, in a dose of about $1 \times 10^{14}$ cm$^{-2}$.

Figure 14:
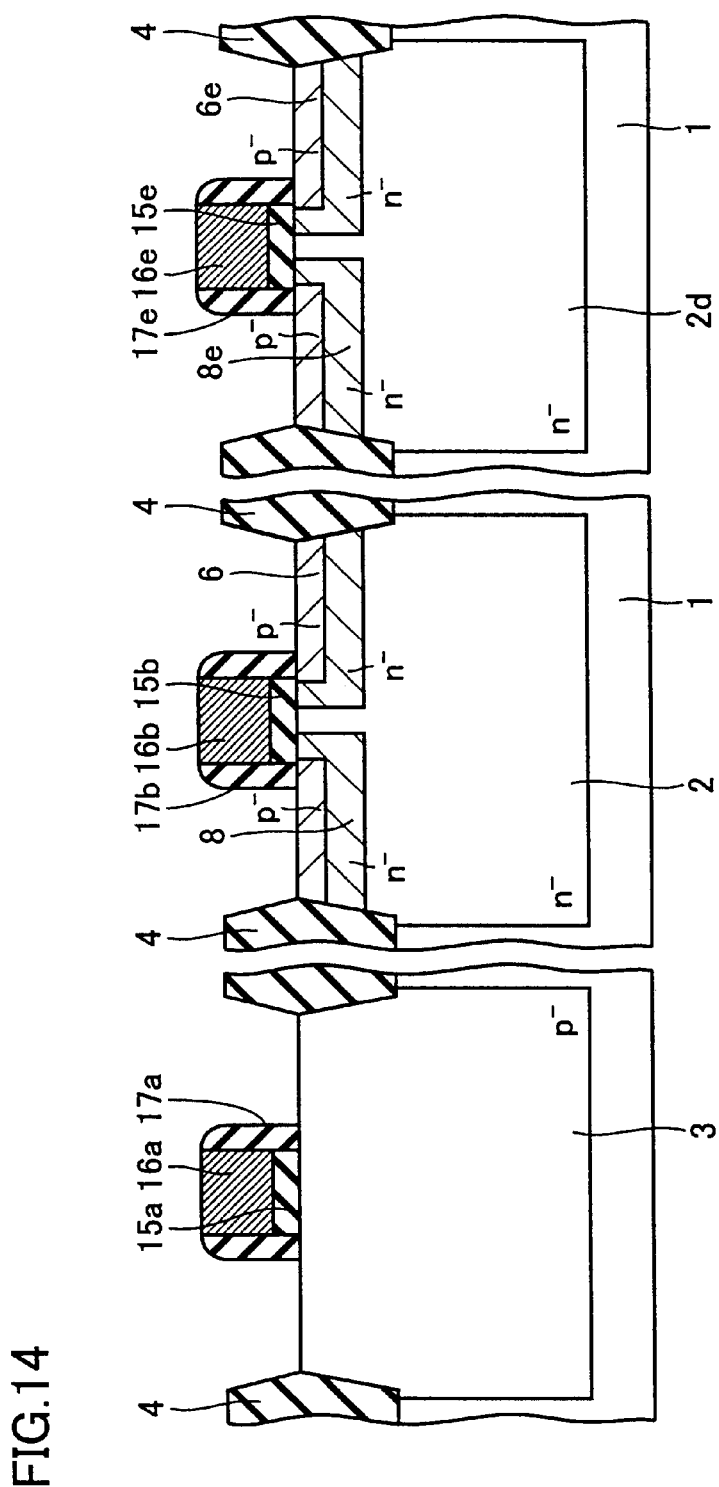

Next, referring to FIG. 14, after removal of resist mask 33, sidewall insulating films 17a, 17b and 17e are formed on the sidewalls of first gate insulating film 15a and first gate electrode 16a, on the sidewalls of second gate insulating film 15b and second gate electrode 16b, and on the sidewalls of third gate insulating film 15e and third gate electrode 16e, respectively.

Figure 15:
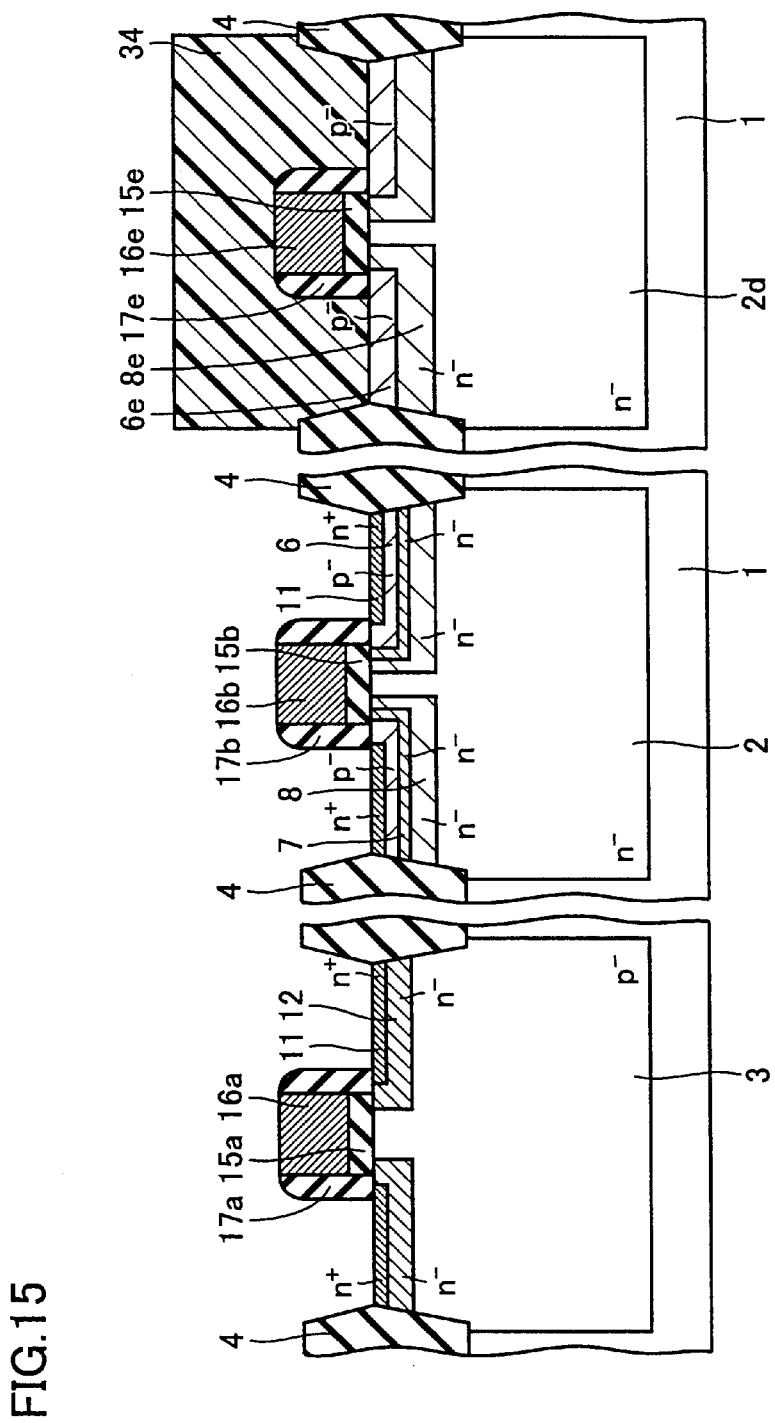

Next, referring to FIG. 15, with the surface of n⁻ type well 2d of p channel type MOS transistor 200D covered with a resist mask 34, and with first gate insulating film 15a and sidewall insulating film 17a, and second gate insulating film 15b and sidewall insulating film 17b used as masks, n type impurity (P, As or the like) is introduced into p⁻ type well 3 to form n⁻ type first impurity diffusion region 12, and, at the same time, n type impurity (P, As or the like) is introduced into n⁻ t type well 2 to form n⁻ type fourth impurity diffusion region 7.

Since the n type impurities are introduced in the presence of the sidewall insulating films, if P is employed, it is introduced at implant energy of 30–60 kev (preferably, about 50 kev) in a dose of $5 \times 10^{12}$ cm$^{-2}$ to $5 \times 10^{13}$ cm$^{-2}$ (preferably, about $3 \times 10^{13}$ cm$^{-2}$), by rotational implantation at an angle of about 45 degrees with respect to the surfaces of p⁻ type well 3 and n⁻ type well 2.

Thereafter, with first gate insulating film 15a and sidewall insulating film 17a, and second gate insulating film 15b and sidewall insulating film 17b used as masks, n type impurity (P, As or the like) is introduced into p⁻ type well 3 and n⁻ type well 2 to form n⁺ type second impurity diffusion regions 11. If As is employed as the n type impurity, it is introduced at implant energy of about 40 kev, in a dose of about $2 \times 10^{15}$ cm$^{-2}$.

Figure 16:
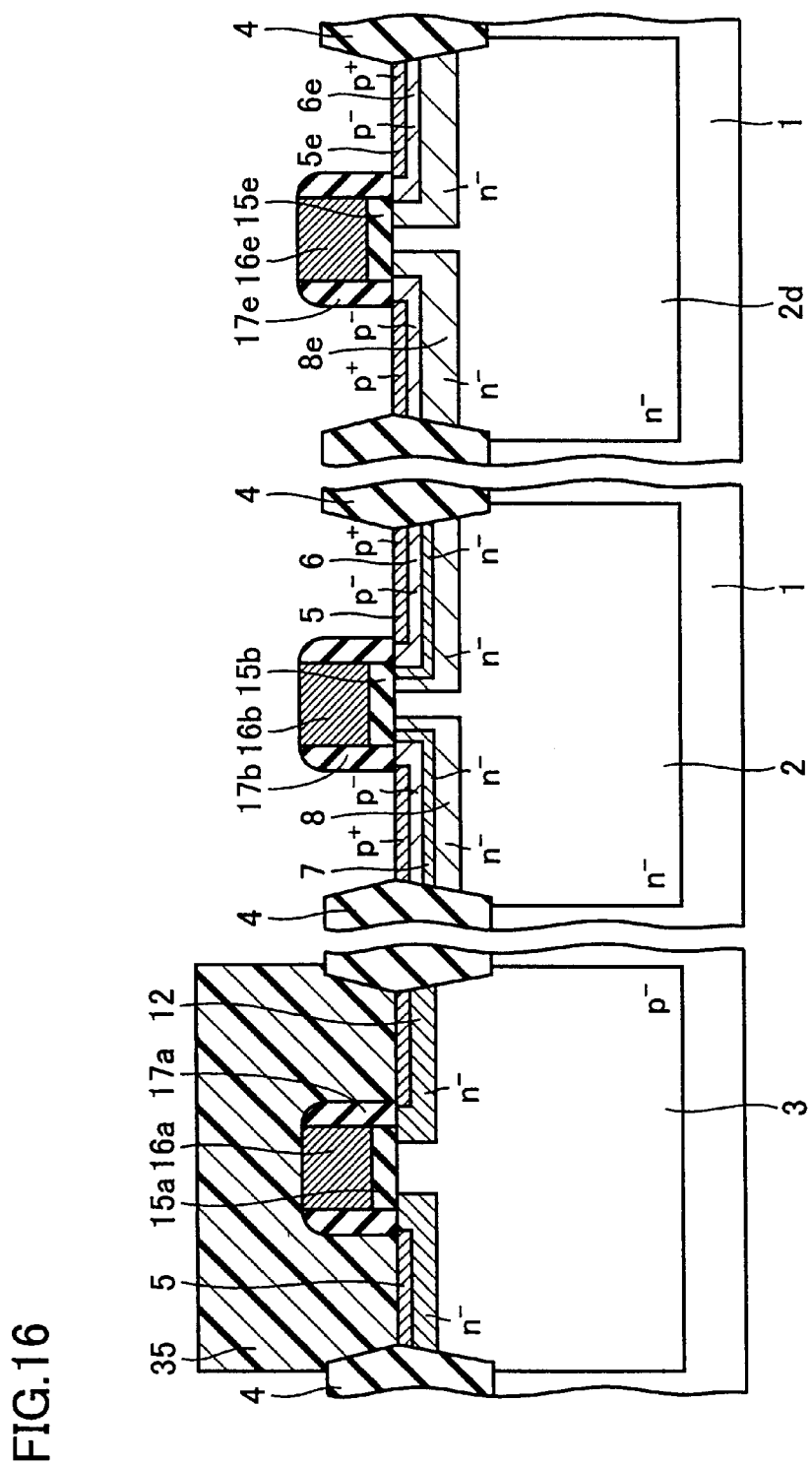

Next, referring to FIG. 16, after removal of resist mask 34, the surface of p⁻ type well 3 of n channel type MOS transistor 100A is covered. With second gate insulating film 15b and sidewall insulting film 17b, and third gate insulating film 15e and sidewall insulating film 17e used as masks, p type impurity (B, BF$_2$ or the like) is introduced into n⁻ type well 2 and n⁻ type well 2d in compensation for n⁺, to form p⁺ type sixth impurity diffusion region 5 and p⁺ type ninth impurity diffusion region 5e, respectively. If BF$_2$ is employed as the p type impurity, it is introduced under the conditions of implant energy of about 30 kev and a dose of about $5 \times 10^{15}$ cm$^{-2}$.

According to the steps described above, the semiconductor device of the present embodiment provided with n channel type MOS transistor 100A, p channel type MOS transistor 200A and p channel type MOS transistor 200D as shown in FIG. 12 is manufactured.

Functions and Effects

The semiconductor device of the present embodiment as described above can enjoy the same functions and effects as in the first embodiment. Further, as shown in FIG. 15, the n type impurity is introduced in the presence of the sidewall insulating films to form n⁻ type fourth impurity diffusion region 7, following the formation of p⁻ type fifth impurity diffusion region 6 and p⁻ type eighth impurity diffusion region 6e constituting the SPI regions. Accordingly, the semiconductor device shown in FIG. 12 can be manufactured without an additional manufacturing step for formation of n⁻ type fourth impurity diffusion region 7.

Here, impurity profiles in channel width directions are explained for both p channel type MOS transistor 200A (the second semiconductor element) having the SPI region formed of n⁻ type fourth impurity diffusion region 7 and n⁻ type third impurity diffusion region 8 and p channel type MOS transistor 200D (the third semiconductor element) having the SPI region formed solely of n⁻ type third impurity diffusion region 8e. It is assumed that the channel width (W) of p channel type MOS transistor 200A is made narrower than the channel width (W) of p channel type MOS transistor 200D.

With this configuration, the total impurity concentration (the first total impurity concentration) of n⁻ type fourth impurity diffusion region 7 and n⁻ type third impurity diffusion region 8 of p channel type MOS transistor 200A is set higher than the total impurity concentration (the second total impurity concentration) of n⁻ type third impurity diffusion region 8e of p channel type MOS transistor 200D. Accordingly, restriction of channel leakage to the same degree as in p channel type MOS transistor 200D becomes possible in p channel type MOS transistor 200A having the channel width (W) narrower than that of p channel type MOS transistor 200D.

From the relation shown in FIG. 8, the channel width (W) of p channel type MOS transistor 200A as the second semiconductor element is preferably not greater than 1 μm, and the channel width (W) of p channel type MOS transistor 200D as the third semiconductor element is preferably not less than 1 μm.

The channel region as a first active region beneath the gate electrode 15b of p channel type MOS transistor 200A and the channel region as a second active region beneath the gate electrode 15e of p channel type MOS transistor 200D have approximately the same impurity concentration distributions. Even though the two transistors have the channel regions of the same structures (same impurity profiles), with the threshold voltage of p channel type MOS transistor 200A being represented as a first threshold voltage, the threshold voltage of p channel type MOS transistor 200D can be set to a second threshold voltage that is lower than the first threshold voltage.

Figure 17A:
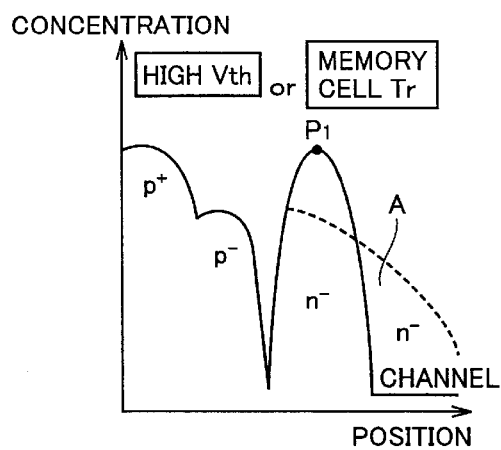
FIGS. 17A and 17B are first figures illustrating impurity profiles of the first and second semiconductor elements, respectively.
Figure 17B:
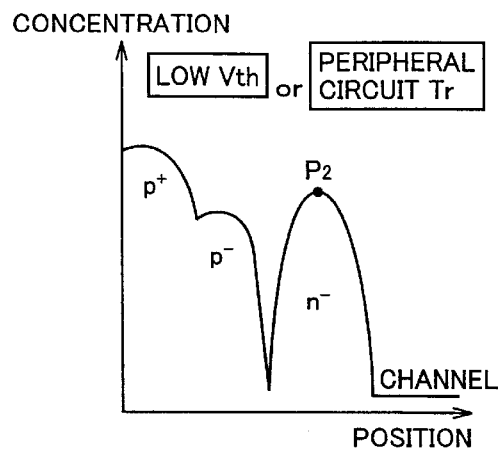

Further, as shown in the impurity profiles in FIGS. 17A and 17B, p channel type MOS transistor 200A having a narrow channel width (W) is further provided with a deep impurity diffusion region A of the same conductivity type as n⁻ type third impurity diffusion region 8 from the impurity concentration peak (P1) of the first total impurity concentration to the channel region. With this configuration, the total sum of the impurity concentrations from the channel region of p channel type MOS transistor 200A having the narrow channel width (W) to the impurity concentration peak (P1) of the first total impurity concentration becomes greater than the total sum of the impurity concentrations from the channel region of p channel type MOS transistor 200D having a wide channel width (W) to the impurity concentration peak (P2) of the second total impurity concentration.

According to this configuration, it is possible to increase a punch-through breakdown voltage in p channel type MOS transistor 200A having a channel width (W) that is narrower than that of p channel type MOS transistor 200D.

Figure 18A:
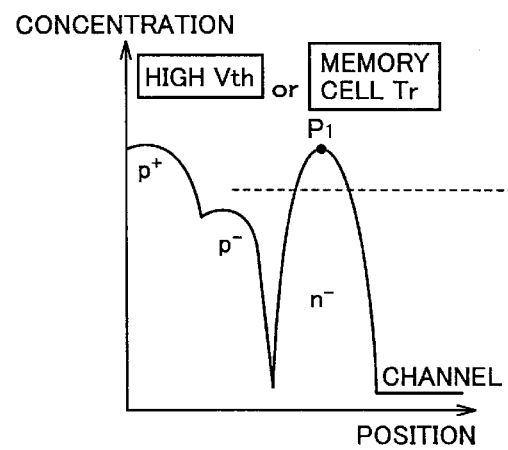
FIGS. 18A and 18B are second figures illustrating the impurity profiles of the first and second semiconductor elements, respectively.
Figure 18B:
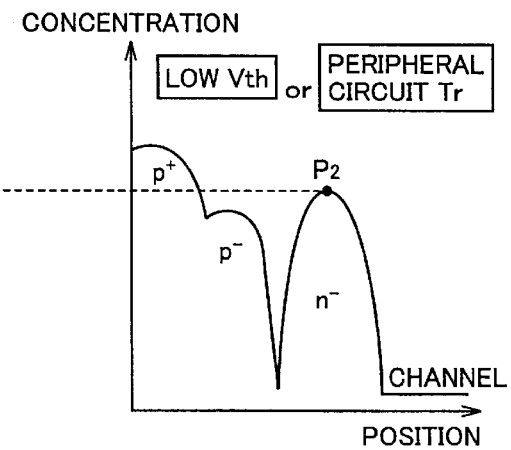
Figure 19:
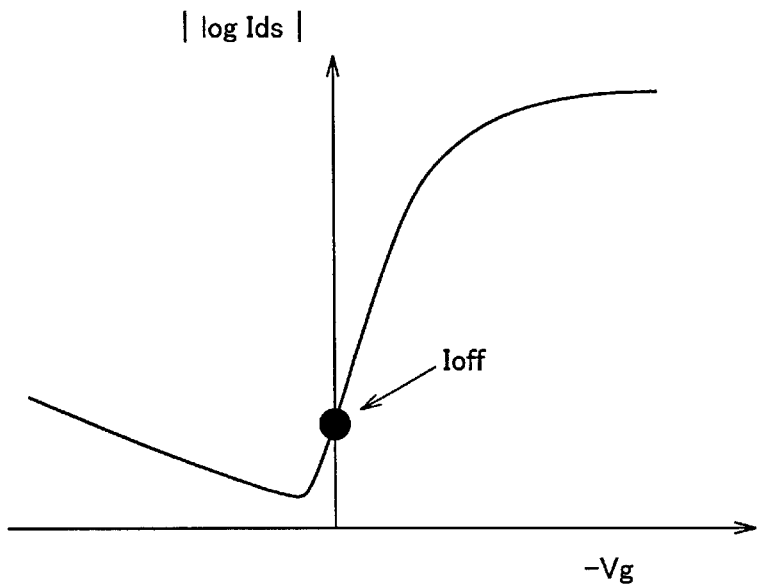
FIG. 19 schematically shows a relation of Vg (gate voltage)—Id (drain current) of a conventional semiconductor device.
Figure 20:
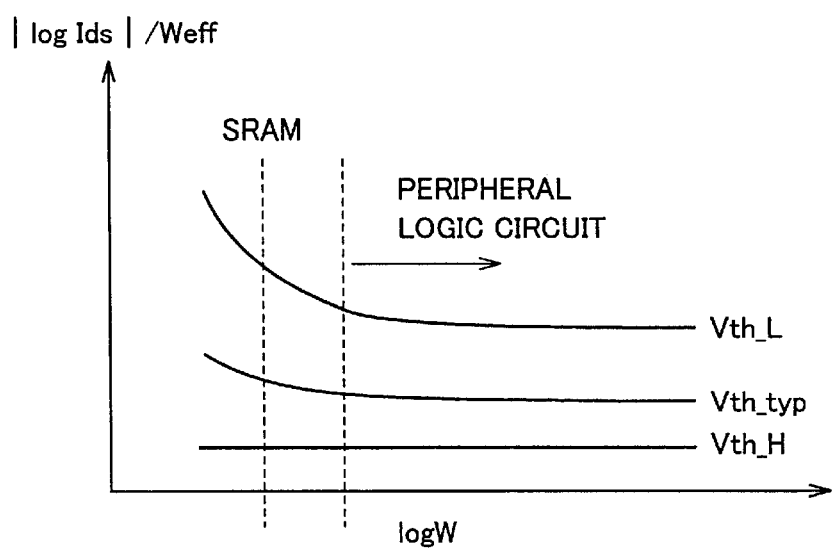
FIG. 20 is a graph showing a relation between |log Ids|/Weff and logW of the conventional semiconductor device.

Further, as seen from the impurity profiles in FIGS. 18A and 18B, the impurity concentration peak (P1) of the first total impurity concentration is set higher than the impurity concentration peak (P2) of the second total impurity concentration. With this configuration, the depletion layer extends further in p channel type MOS transistor 200D of wide channel width (W) than in p channel type MOS transistor 200A of narrow channel width (W), thereby restricting junction capacitance. In particular, p channel type MOS transistor 200D of wide channel width (W) is applicable to a circuit affecting an operating speed, and, as a result, a semiconductor device operating at high speed can be realized.

As described above, not only the first total impurity concentration of the SPI region of p channel type MOS transistor 200A formed of n⁻ type fourth impurity diffusion region 7 and n⁻ type third impurity diffusion region 8 being different from the second total impurity concentration of the SPI region of p channel type MOS transistor 200D formed of n⁻ type third impurity diffusion region 8e, but also the film thickness of gate oxide film 15b of p channel type MOS transistor 200A being made greater than that of gate oxide film 15e of p channel type MOS transistor 200D, make it possible to further increase the difference in threshold voltage between p channel type MOS transistor 200A and p channel type MOS transistor 200D.

In the embodiments described above, the case where n⁻ type fourth impurity diffusion region 7 is located inside n⁻ type third impurity diffusion region 8 has been described as an example. Alternatively, n⁻ type fourth impurity diffusion region 7 formed at the same time as n⁻ type first impurity diffusion region 12 may be located outside n⁻ type third impurity diffusion region 8.

Further, in the embodiments described above, the case where an n channel type MOS transistor unprovided with the SPI region and a p channel type MOS transistor provided with the SPI region are combined has been described. However, the same functions and effects can be enjoyed even if the n channel type and the p channel type are reversed.

According to an aspect of the semiconductor device based on the present invention, the first total impurity concentration forming, e.g., the SPI region of a first semiconductor element is set higher than the second total impurity concentration forming, e.g., the SPI region of a second semiconductor element. Accordingly, even in the first semiconductor element having a channel width narrower than in the second semiconductor element, it is possible to restrict channel leakage to the same degree as in the second semiconductor element.

According to another aspect of the semiconductor device based on the present invention, not only the impurity concentrations of the SPI region formed of the first and second impurity diffusion regions in the first semiconductor element and of the SPI region formed of the fifth impurity diffusion region in the second semiconductor element are differentiated from each other, but also the film thicknesses of the gate oxide films are differentiated. Accordingly, it is possible to further increase the difference in threshold voltage between the first and second semiconductor elements.

According to a further aspect of the semiconductor device based on the present invention, the SPI region is formed of the third and fourth impurity diffusion regions to locally increase the impurity concentration of the relevant SPI region, so that the threshold voltage of the second semiconductor element is further increased. As a result, the present invention is applicable to a semiconductor device having both a first semiconductor element of low threshold voltage and unprovided with an SPI region and a second semiconductor element of high threshold voltage and provided with the SPI region.

Furthermore, according to the manufacturing method of a semiconductor device based on the present invention, the fourth impurity diffusion region in the second semiconductor element is formed at the same time as the step of forming the first impurity diffusion region in the first semiconductor element. Thus, an additional step of forming the fourth impurity diffusion region is unnecessary. As a result, it is possible to manufacture a semiconductor device provided with a plurality of semiconductor elements of different threshold voltages, without increasing a number of manufacturing steps, WP TAT or manufacturing cost of the semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a first semiconductor element having a channel type and a second semiconductor element having the same channel type as said first semiconductor element, said first semiconductor element comprising:
a first active region in a semiconductor substrate;
a first gate electrode on said first active region with a first gate insulating film interposed between said first gate electrode and the semiconductor substrate;
a pair of first impurity diffusion regions having the same conductivity type as said first active region; located in said first active region, and sandwiching said first gate electrode;
second impurity diffusion regions having the same conductivity type as said first impurity diffusion regions, respectively located in said first impurity diffusion regions, and shallower in depth in the semiconductor substrate than diffusion depth of said first impurity diffusion regions;
third impurity diffusion regions having a different conductivity type from said second impurity diffusion regions, respectively located in said second impurity diffusion regions, and shallower in depth in the semiconductor substrate than diffusion depth of said second impurity diffusion regions; and
fourth impurity diffusion regions having the same conductivity type as said third impurity diffusion regions, respectively located in said third impurity diffusion regions, and shallower in the semiconductor substrate than diffusion depth of said third impurity diffusion regions; and said second semiconductor element comprising:
a second active region having the same conductivity type as said first active region and located in the said semiconductor substrate;
a second gate electrode on said second active region with a second gate insulating film interposed between said second gate electrode and the semiconductor substrate;
a pair of fifth impurity diffusion regions corresponding to said first impurity diffusion regions and having the same conductivity type as said first impurity diffusion regions;
sixth impurity diffusion regions corresponding to said third impurity diffusion regions and having the same conductivity type as said third impurity diffusion regions; and
seventh impurity diffusion regions corresponding to said fourth impurity diffusion regions and having the same conductivity type as said fourth impurity diffusion regions, wherein
said first semiconductor element is a transistor for use in a memory cell region,
said second semiconductor element is a transistor for use in a peripheral circuit region, and
a first total impurity concentration of said first impurity diffusion region and of said second impurity diffusion region in said first semiconductor element is higher than a second total impurity concentration of said fifth impurity diffusion region in said second semiconductor element.

2. The semiconductor device according to claim 1, wherein a channel region of said first active region beneath said first gate electrode has a width not greater than 1 $\mu$m, and a channel region of said second active region beneath said second gate electrode has a width not less than 1 $\mu$m.

3. A semiconductor device including a first semiconductor element having a channel type and a second semiconductor element having the same channel type as said first semiconductor element, said first semiconductor element comprising:
a first active region in a semiconductor substrate;
a first gate electrode on said first active region with a first gate insulating film interposed between said first gate electrode and the semiconductor substrate;
a pair of first impurity diffusion regions having the same conductivity type as said first active region, located in said first active region, and sandwiching said first gate electrode;
second impurity diffusion regions having the same conductivity type as said first impurity diffusion regions, respectively located in said first impurity diffusion regions, and shallower in depth in the semiconductor substrate than diffusion depth of said first impurity diffusion regions;
third impurity diffusion regions having a different conductivity type from said second impurity diffusion regions, respectively located in said second impurity diffusion regions, and shallower in depth in the semiconductor substrate than diffusion depth of said second impurity diffusion regions; and
fourth impurity diffusion regions having the same conductivity type as said third impurity diffusion regions, respectively located in said third impurity diffusion regions, and shallower in the semiconductor substrate than diffusion depth of said third impurity diffusion regions; and said second semiconductor element comprising:

a second active region having the same conductivity type as said first active region and located in the said semiconductor substrate;

a second gate electrode on said second active region with a second gate insulating film interposed between said second gate electrode and the semiconductor substrate;

a pair of fifth impurity diffusion regions corresponding to said first impurity diffusion regions and having the same conductivity type as said first impurity diffusion regions;

sixth impurity diffusion regions corresponding to said third impurity diffusion regions and having the same conductivity type as said third impurity diffusion regions; and seventh impurity diffusion regions corresponding to said fourth impurity diffusion regions and having the same conductivity type as said fourth impurity diffusion regions, wherein said first semiconductor element has a first threshold voltage, said second semiconductor element has a second threshold voltage lower than the first threshold voltage, a first total impurity concentration of said first impurity diffusion region and of said second impurity diffusion region in said first semiconductor element is higher than a second total impurity concentration of said fifth impurity diffusion region in said second semiconductor element, and an impurity concentration distribution in said first active region beneath said first gate electrode in said first semiconductor element is approximately the same as an impurity concentration distribution in said second active region beneath said second gate electrode in said second semiconductor element.

4. The semiconductor device according to claim 3 wherein total impurity concentrations from a channel region of said first active region beneath said first gate electrode, to an impurity concentration peak of said first total impurity concentration is higher than total impurity concentrations from a channel region of said second active region, beneath said second gate electrode, to an impurity concentration peak of the second total impurity concentration.

5. The semiconductor device according to claim 4, wherein the impurity concentration peak of the first total impurity concentration is higher than the impurity concentration peak of the second total impurity concentration.

6. A semiconductor device including a first semiconductor element having a channel type and a second semiconductor element having the same channel type as said first semiconductor element, said first semiconductor element comprising:
a first active region in a semiconductor substrate;
a first gate electrode on said first active region with a first gate insulating film interposed between said first gate electrode and the semiconductor substrate;
a pair of first impurity diffusion regions having the same conductivity type as said first active region, located in said first active region, and sandwiching said first gate electrode;
second impurity diffusion regions having the same conductivity type as said first impurity diffusion regions, respectively located in said first impurity diffusion regions, and shallower in depth in the semiconductor substrate than diffusion depth of said first impurity diffusion regions;
third impurity diffusion regions having a different conductivity type from said second impurity diffusion regions, respectively located in said second impurity diffusion regions, and shallower in depth in the semiconductor substrate than diffusion depth said second impurity diffusion regions; and
fourth impurity diffusion regions having the same conductivity type as said third impurity diffusion regions, respectively located in said third impurity diffusion regions, and shallower in the semiconductor substrate than diffusion depth of said third impurity diffusion regions; and said second semiconductor element comprising:
a second active region having the same conductivity type as said first active region and located in the said semiconductor substrate;
a second gate electrode on said second active region with a second gate insulating film interposed between said second gate electrode and the semiconductor substrate;
a pair of fifth impurity diffusion regions corresponding to said first impurity diffusion regions and having the same conductivity type as said first impurity diffusion regions;
sixth impurity diffusion regions corresponding to said third impurity diffusion regions and having the same conductivity type as said third impurity diffusion regions; and
seventh impurity diffusion regions corresponding to said fourth impurity diffusion regions and having the same conductivity type as said fourth impurity diffusion regions, wherein
a channel region of said first active region beneath said first gate electrode has a width narrower than a width of a channel region of said second active region beneath said second gate electrode, and
said first gate insulating film of said first semiconductor element has a thickness larger than thickness of said second gate insulating film of said second semiconductor element.

* * * * *